INVENTOR.
ARDEN J. WOLTERMAN
BY Wade Koontz
ATTORNEY and
Herbert E. Farmer
AGENT INVENTOR.
ARDEN J. WOLTERMAN
BY
Herbert E. Jamer
ATTORNEYS United States Patent Office 3,217,187

Patented Nov. 9, 1965

3,217,187

INVERTER CIRCUIT

Arden J. Wolterman, Apalachin, N.Y., assignor to the United States of America as represented by the Secretary of the Air Force Filed Oct. 28, 1963, Ser. No. 319,621
3 Claims. (Cl. 307—88.5)

This invention relates to inverter circuits, and more particularly to an inverter circuit compatible with Goto logic circuits in that no delay is experienced in the inversion.

Goto logic circuitry using Esaik diodes is fully described in E. Goto et al. in IRE Transactions on Electronic Computers, March 1960, pages 25–29, in an article entitled "Esaki Diode High-Speed Logical Circuit." As described in the article, the basic element used to perform logic operations such as AND, OR and NOT operations is two diodes connected in series to form a twin. A binary digit is represented by the polarity of the potential induced at the middle point (node) of the twin.

The inverter circuit of the instant invention has utility in logic circuits for very high speed digital computers performing up to a billion bit rate (1000-mc. clock machine).

Accordingly, an object of the present invention is to provide an inverter circuit which is compatible with Goto logic circuits.

Another object of this invention is to provide an inverter circuit which enables a Goto twin node to attain a voltage level equal to that of other computer circuits.

Other objects of this invention will become apparent from the following description when taken in connection with the accompanying drawings wherein.

Figure 1:
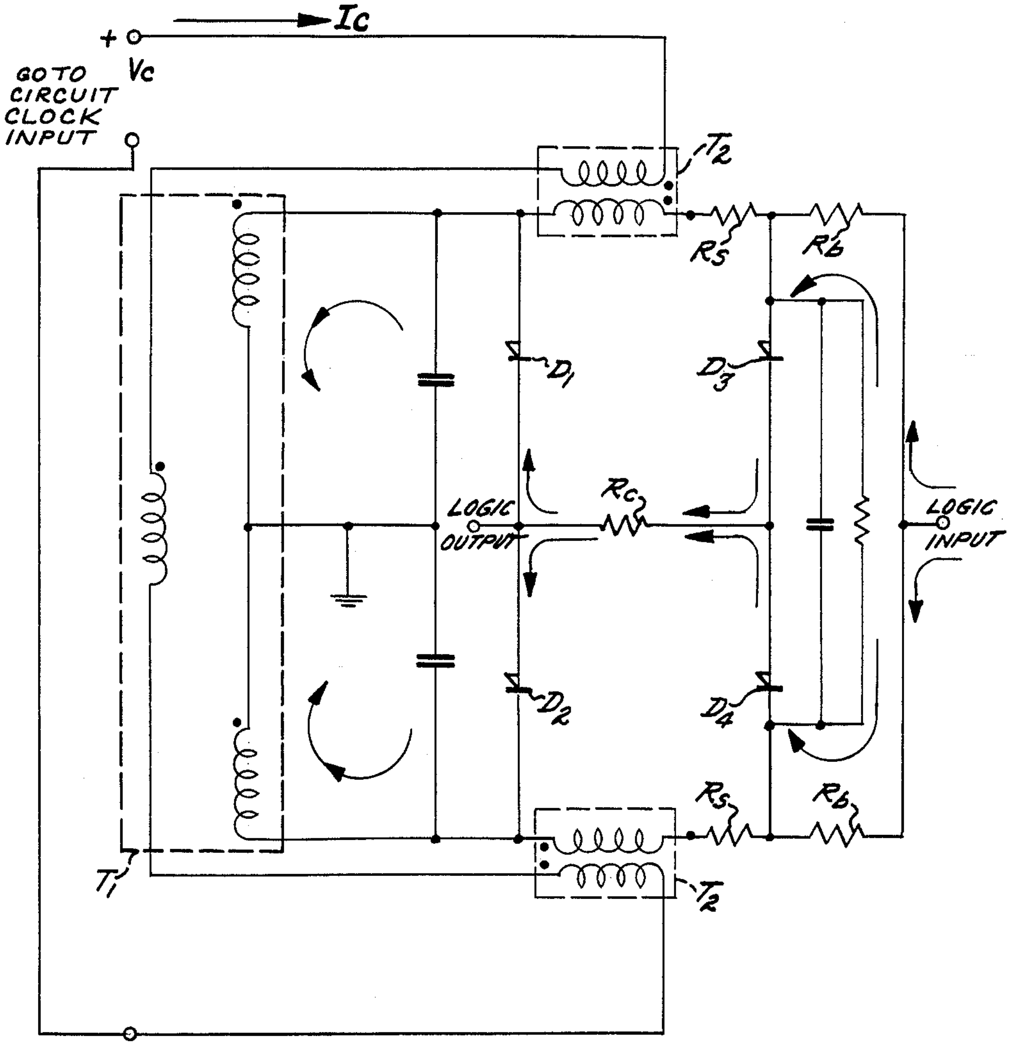
FIGURE 1 is a circuit diagram of the instant inverter.

Now referring to FIGURE 1, the elements to the right of transformer T2 comprise the inverter. The remainder is a standard twin circuit with a clock transformer and distribution system. The primary terminals of $T_2$ are clocking inputs (such as described in the previously cited article) and are connected to a clock driver capable of delivering the necessary current and/or voltage. It should be noted that the clock driver may be a voltage source (which generates $V_c$) or a current source (which generates the current ramp $I_c$). The clock transformer and twin circuit diodes then form a complete circuit in that the logic output terminal may be used to drive the logic input terminal of another inverter circuit as shown or the logic input of a non-inverting Goto circuit. T2 supplies the inverter with the required clock voltage and insures that the inverter is set before the twin circuit. The circuit thus assumes the same polarity as the inverter output.

Prior to supplying the current ramp to the transformer primaries, a positive node voltage is applied to the logic input. This provides steering current through input resistors R*b*. The logic input current path through resistors $R_b$, diodes $D_3$ and $D_4$, resistor $R_c$, diodes $D_1$ and $D_2$, and the secondary of transformer $T_1$ to ground is illustrated in FIGURE 1. From FIGURE 1 it can be seen that series-connected diodes $D_3$ and $D_4$ are in parallel with the logic input in that the input current splits and flows in parallel through each of the diodes. Most of the input current flows through D3 and D4 to establish the proper inversion biasing conditions. This is because the series resistors R*s* are much larger than the total resistance of diodes D3 and D4 plus coupling resistor R*c*. The current, which returns to ground through the Goto twin diodes and T1 secondary, reversely biases D1 and D2. Consequently, the circuit requires that the clock voltage applied to D3 and D4 attain the switching threshold 2V*p* before the voltage supplied to D1 and D2 reaches the same level.

Figure 2:
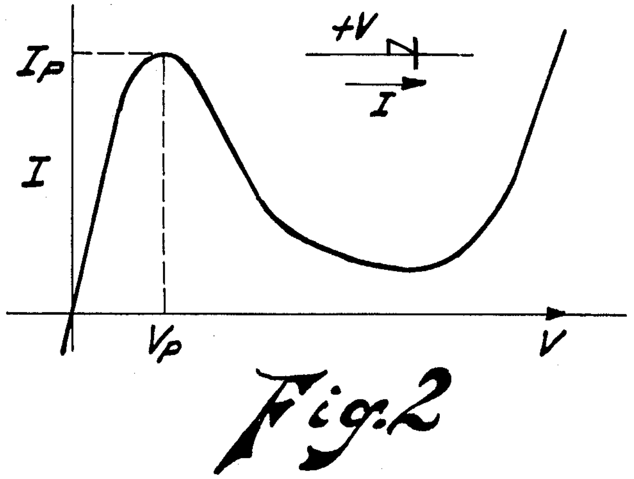
FIGURE 2 illustrates the typical voltage-current characteristic of the Esaki diode.
Figure 3:
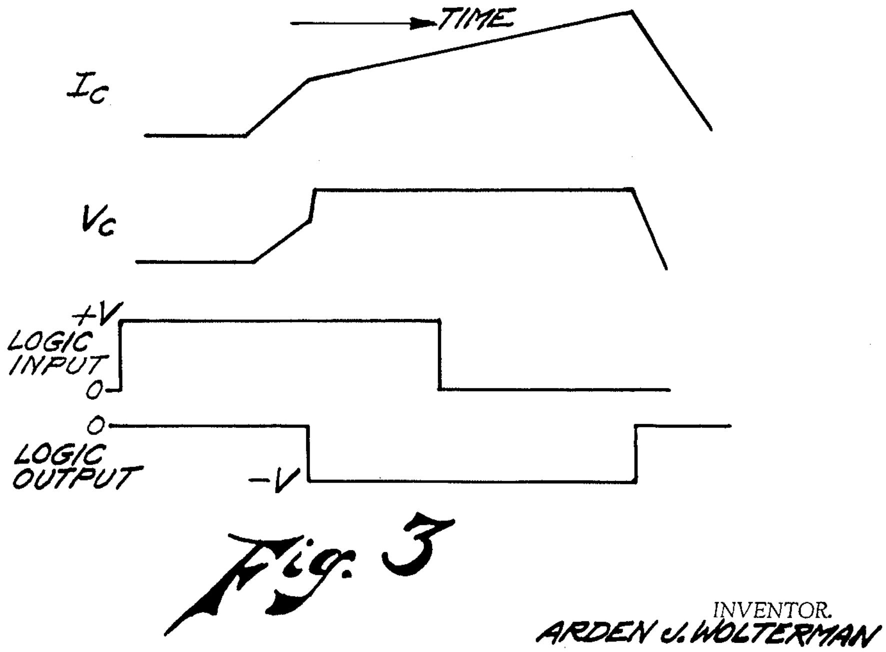
FIGURE 3 illustrates the waveforms and time sequence for the signals applied to the instant inverter circuit.

FIGURE 2 illustrates an Esaki diode (or tunnel diode) current-voltage characteristic and serves to identify peak voltage, $V_p$. FIGURE 3 illustrates the voltage and current signals which are applied to the terminals of the circuit shown in FIGURE 1.

The current-ramp input to the series-connected transformer primaries causes the voltages across the two twin circuits to rise. However, the inverter voltage increases faster than the Goto twin voltage due to the additional voltage supplied by T2. Thus, when the inverter clock voltage reaches the switching threshold, the Goto twin clock voltage is less than 2V*p*.

The inverter node assumes a negative voltage state, when the voltage across D3 and D4 exceeds the threshold. The transition occurs rapidly if the node distributed capacitance is small. Current now flows from the Goto twin node, reversing the steering current conditions and switching the Goto twin when the clock voltage becomes sufficient. A negative output node voltage results.

The sudden increase in Goto twin clock voltage produces an increased inverter clock voltage. The increased twin circuit node voltage reduces the current in R*c*. Under these conditions, the load line approaches the horizontal and the increased inverter clock voltage does not change the inverter state. This completes the inversion process and the Goto twin node has attained a voltage level equal to that of other computer twin circuits.

Although the invention has been described and illustrated in detail, it is to be clearly understood that the same is by way of illustration and example only and is not to be taken by way of limitation, the spirit and scope of this invention being limited only by the terms of the appended claims.

What is claimed is:

1. In combination with a Goto computer logic circuit having a Goto twin diode and a clock transformer and distribution system for said Goto twin, inverter means comprising logic input means, input resistance means connected to said logic input means causing the input current to split and flow in parallel, series resistance means connected to said input resistance means, a pair of diodes connected in series to form a twin, said twin connected in parallel with said logic input and intermediate said input and series resistance means, bypass means for said diode twin, coupling means connected intermediate said diode twin and said Goto twin diode, and coacting with said resistance means and twin to cause a negative voltage output when a positive voltage is applied to said logic input.

2. The circuit as described in claim 1 wherein said twin is a pair of Esaki diodes.

3. The circuit as described in claim 1 wherein said series resistance means have a much larger resistance than said twin and said coupling means.

No references cited.

ARTHUR GAUSS, *Primary Examiner.*